United States Patent [19]

Omori et al.

[11] Patent Number: 5,515,291
[45] Date of Patent: May 7, 1996

[54] APPARATUS FOR CALCULATING DELAY TIME IN LOGIC FUNCTIONAL BLOCKS

[75] Inventors: Naoko Omori; Michio Komoda, both of Itami, Japan

[73] Assignee: Mitsubishi Denki Kabushiki Kaisha, Tokyo, Japan

[21] Appl. No.: 929,828

[22] Filed: Aug. 14, 1992

[30] Foreign Application Priority Data

Aug. 23, 1991 [JP] Japan ..................... 3-211785

[51] Int. Cl.⁶ .......................... G06F 15/00; H03K 19/02
[52] U.S. Cl. ................... 364/488; 364/491; 340/825.87; 326/16; 326/21; 326/119; 327/261
[58] Field of Search ..................... 364/488, 490, 364/491, 489, 481, 571, 480, 482; 340/825.87; 307/446, 443, 592, 593

[56] References Cited

U.S. PATENT DOCUMENTS

| | | | |
|---|---|---|---|
| 4,196,475 | 4/1980 | Hall | 364/482 |
| 4,263,651 | 4/1981 | Donath et al. | 364/491 |
| 4,342,089 | 7/1982 | Hall | 364/481 |
| 4,587,480 | 5/1986 | Zasio | 324/73 R |
| 4,631,686 | 12/1986 | Ikawa et al. | 364/490 |
| 4,698,760 | 10/1987 | Lemback et al. | 364/488 |
| 4,972,412 | 11/1990 | Satoh | 371/22.1 |
| 5,001,365 | 3/1991 | Murabayashi et al. | 307/446 |
| 5,202,841 | 4/1993 | Tani | 364/489 |
| 5,231,588 | 7/1993 | Agrawal et al. | 364/489 |

FOREIGN PATENT DOCUMENTS 3910507  4/1990  Germany.

OTHER PUBLICATIONS

Gate Ensemble User Guide, Release 2.0, Chapter 12.2, pp. 12-4–12-11, "Delay Modeling", No Date.

*Primary Examiner*—Kevin J. Teska
*Assistant Examiner*—Jacques H. Louis-Jacques
*Attorney, Agent, or Firm*—Oblon, Spivak, McClelland, Maier & Neustadt

[57] ABSTRACT

A delay parameter calculator (13) calculates an input slew rate (tr) as a function of a layout pattern information (D12) to determine delay parameters (K) by substituting the slew rate (tr) for a delay parameter function (K(tr)). An output impedance calculator (15) calculates an impedance (RS) of an accurate output macro cell (21) as a function of a capacitance lumped constant (C) and the delay parameters (K). A delay time calculator (16) solves an equation having the output impedance (RS) as a significant parameter to correctly calculate a delay time (DT) it takes to transmit a signal from an input to an output of a logic functional block composed of MOS transistors.

5 Claims, 4 Drawing Sheets

APPARATUS FOR CALCULATING DELAY TIME IN LOGIC FUNCTIONAL BLOCKS

BACKGROUND OF THE INVENTION

1. Field of the Invention

The present invention relates to an apparatus and method for calculating a delay time it takes to transmit a signal from an input to an output of a logic functional block composed of MOS transistors.

2. Description of the Background Art

FIG. 4 is a block diagram of a conventional apparatus for calculating a delay time between logic functional blocks (hereinafter referred to as "macro cells"). As shown in FIG. 5, the apparatus calculates, between macro cells 21 and 22, a signal transmission delay time DT that is the time interval between the input of a signal S21 to the macro cell 21 and the output of a signal S22 (which is inputted to the macro cell 22) from the macro cell 21. With reference to FIG. 5, description will be given hereinafter on the delay time calculation apparatus of FIG. 4.

An RC lumped constant calculator 1 receives a layout pattern information D2 including the macro cells 21, 22 from a layout pattern storage file 2 and extracts an actual wiring length between the macro cells 21 and 22 from the layout pattern information D2. Taking the wiring between the macro cells 21 and 22 as a distributed constant line, the RC lumped constant calculator 1 calculates a resistance lumped constant R and a capacitance lumped constant C as RC lumped constants of an output-side (pin-side) wiring portion of the macro cell 21 from the actual wiring length between the macro cells 21 and 22.

A delay parameter retrieval portion 3 receives the layout pattern information D2 from the layout pattern storage file 2 and recognizes the type of the macro cell 21, to retrieve a fixed delay term K0 inherent in the macro cell 21 from a fixed delay information D4 stored in a delay information storage file 4.

An output impedance retrieval portion 5 receives the layout pattern information D2 from the layout pattern storage file 2 and recognizes the type of the macro cell 21, to retrieve a fixed output impedance RS0 inherent in the macro cell 21 from the fixed delay information D4 stored in the delay information storage file 4.

A delay time calculator 6 solves a predetermined delay calculation equation as a function of the parameters R, C, K0 and RS0 retrieved in the portions 1, 3 and 5, to calculate the delay time it takes to transmit the signal from the input to the output of the macro cell 21.

In the conventional delay time calculation apparatus thus constructed, the output impedance of the logic functional block (macro cell 21), which is one of the parameters for determining the delay time, is fixed in accordance with the type of logic functional block.

In practice, however, the output impedance and a fixed delay based on an output load of the macro cell 21 are not fixed. It is known that the output impedance of the macro cell, if composed of MOS transistors, is dependent on gate and drain voltages.

There has been a problem that the delay time is not calculated with high accuracy when the output impedance is fixed for each macro cell as seen in the prior art.

When the output impedance for each macro cell is subdivided in accordance with variations in gate and drain voltages for accurate calculation of the delay time in the conventional method, the capacitance to be stored in the fixed delay information file 4 greatly increases. This is not suitable for practical application.

SUMMARY OF THE INVENTION

The present invention is intended for an apparatus for calculating a delay time it takes to transmit a signal from an input portion to an output portion of a logic functional block including an MOS transistor. According to the present invention, the apparatus comprises means for providing an arrangement and wiring result including a layout pattern ranging from the input portion to the output portion of the logic functional block; delay parameter storage means for storing at least one delay parameter which is a function of input slew rate in accordance with various logic functional blocks; an RC lumped constant calculator for calculating an RC lumped constant of an output-side wiring portion of the logic functional block as a function of the arrangement and wiring result; delay parameter determination means for receiving a delay parameter in accordance with the logic functional block as a selected delay parameter from the delay parameter storage means and determining an input slew rate of the logic functional block as a function of the arrangement and wiring result to output an value of the selected delay parameter determined by the input slew rate as a selected delay parameter determined value; output impedance calculation means for calculating an output impedance of the logic functional block from a predetermined output impedance calculation equation as a function of a capacitance of the RC lumped constant and the selected delay parameter determined value; and delay time calculation means for calculating the delay time from a predetermined delay time calculation equation as a function of the RC lumped constant and the output impedance.

In the apparatus of the present invention, the output impedance calculator calculates the output impedance of the logic functional block from the predetermined output impedance calculation equation as a function of the capacitance of the RC lumped constant and the selected delay parameter determined value. The selected delay parameter determined value is determined by the delay parameter determination means as a function of the input slew rate of the logic functional block.

Since the input slew rate and capacitance of the RC lumped constant of the output-side wiring portion of the logic functional block are respectively correlative with the gate and drain voltages of the MOS transistor, the output impedance of the logic functional block which is determined variably based on the input slew rate and capacitance of the logic functional block is an accurate value in accordance with the gate and drain voltages of the MOS transistor.

As a result, there is provided an improved accuracy of the delay time it takes to transmit the signal from the input to the output of the logic functional block which delay time is calculated from the delay time calculation equation having the output impedance as a significant parameter.

The present invention is also intended for a method of calculating a delay time it takes to transmit a signal from an input portion to an output portion of a logic functional block including an MOS transistor. According to the present invention, the method comprises the steps of calculating an RC lumped constant of an output-side wiring portion of the logic functional block as a function of an arrangement and wiring result including a layout pattern ranging from the input portion to the output portion of the logic functional block; extracting at least one delay parameter which is a function of input slew rate as a selected delay parameter in accordance with the logic functional block; determining an input slew rate of the logic functional block as a function of the arrangement and wiring result to determine a selected delay parameter determined value by substituting the input slew rate for the selected delay parameter; calculating an output impedance of the logic functional block from a predetermined output impedance calculation equation as a function of a capacitance of the RC lumped constant and the selected delay parameter determined value; and calculating the delay time from a predetermined delay time calculation equation as a function of the RC lumped constant and the output impedance.

In the method of the present invention, the output impedance of the logic functional block is accurately calculated in accordance with variations in the gate and drain voltages of the MOS transistor, to correctly calculate the delay time it takes to transmit the signal from the input to the output of the logic functional block.

It is an object of the present invention to provide an apparatus and method for correctly calculating a delay time it takes to transmit a signal from an input to an output of a logic functional block composed of MOS transistors.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
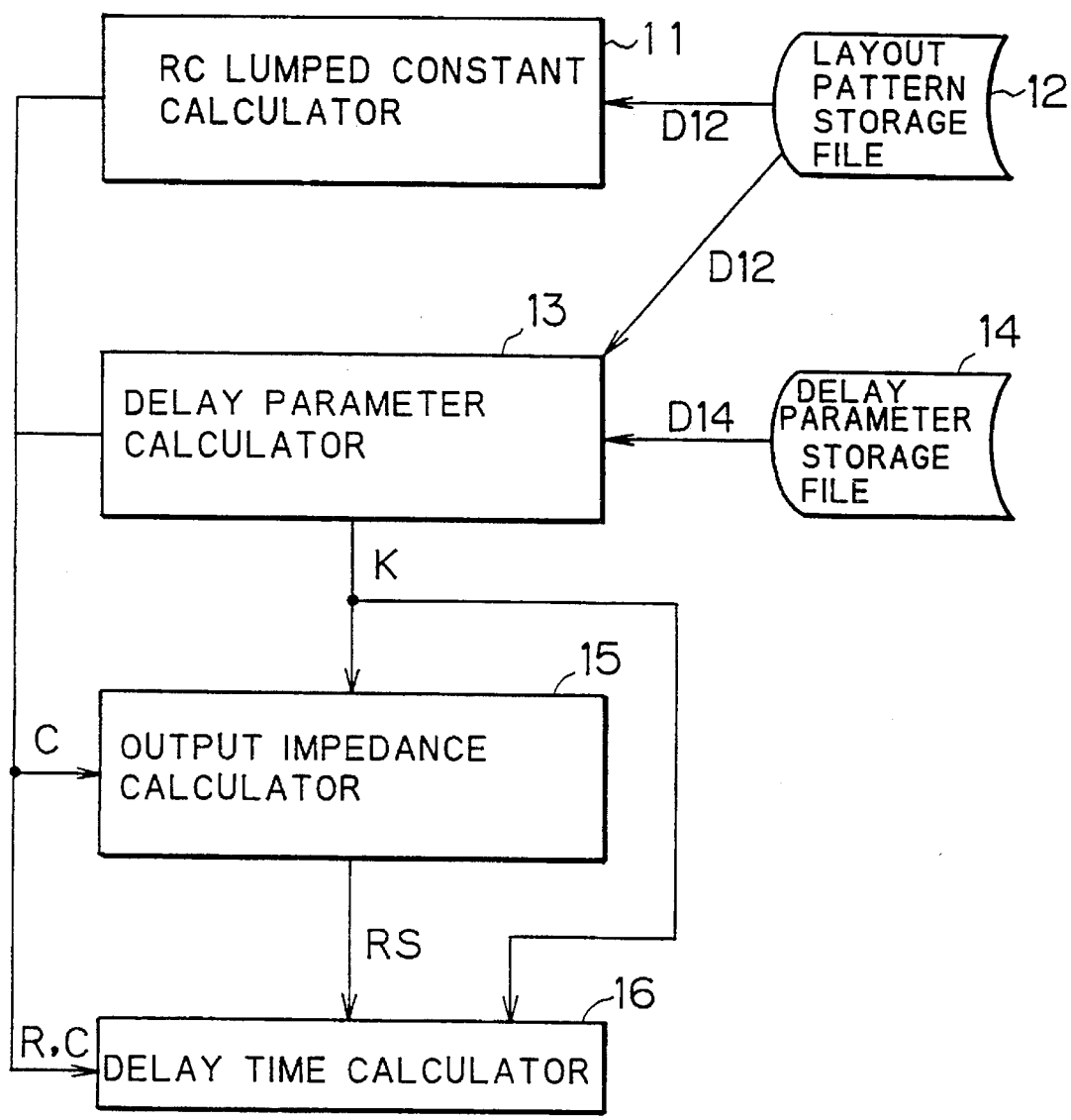
FIG. 1 is a block diagram of a delay time calculation apparatus according to a preferred embodiment of the present invention.
Figure 5:
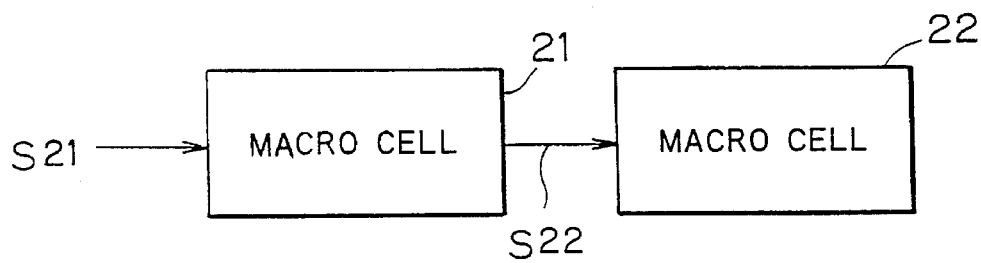
FIG. 5 is a block diagram illustrating signal transmission delay between macro cells.

FIG. 1 is a block diagram of an apparatus for calculating an input-to-output delay time. Similarly to the prior art, the apparatus calculates, between macro cells 21 and 22, a signal transmission delay time DT that is the time interval between the input of a signal S21 to the macro cell 21 and the output of a signal S22 (which is inputted to the macro cell 22) from the macro cell 21, as shown in FIG. 5.

Figure 2:
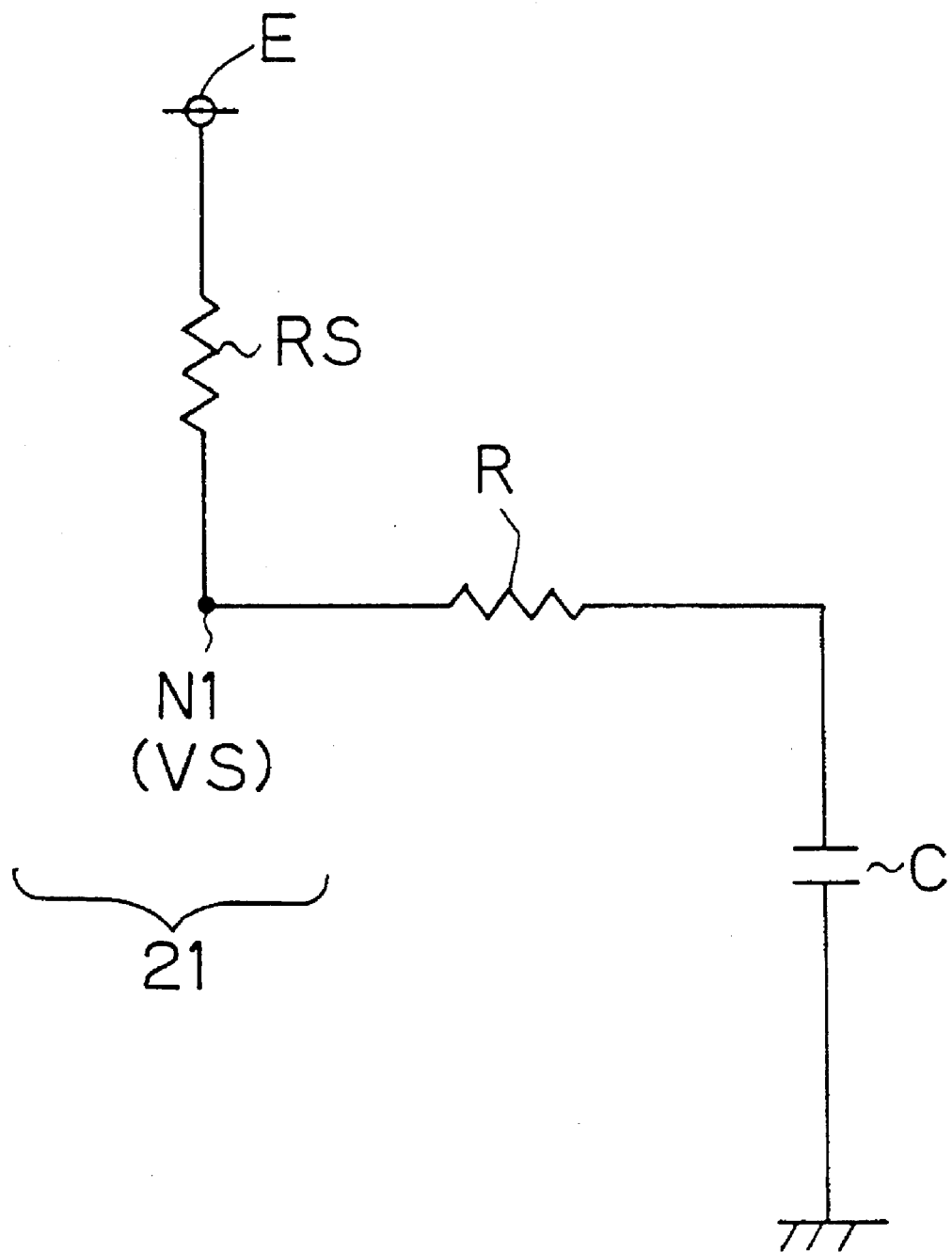
FIG. 2 is an equivalent circuit diagram showing an RC model of an output-side wiring portion of a macro cell.

There is shown in FIG. 2 an equivalent circuit of an RC model of an output-side wiring portion of the macro cell 21 assumed to be a CMOS inverter to which a falling signal in the form of the input signal S21 is inputted. In FIG. 2, reference character RS designates an output impedance of the macro cell 21; R designates a resistance lumped constant in RC lumped constants of the output-side wiring portion of the macro cell 21; and C designates a capacitance lumped constant in the RC lumped constants of the output-side wiring portion of the macro cell 21.

In the equivalent circuit of FIG. 2, the delay time DT is determined as the time required for an output voltage VS of the macro cell 21 obtained from a node N1 to become equal to a threshold voltage in a charging process of the capacitance lumped constant C. The output voltage VS is determined by:

$$VS = E \left\{ 1 - \exp\left( -\frac{t}{C(RS+R)} \right) \right\} \quad (1)$$

where t is a time interval from the start of charging; E is a supply voltage of the macro cell 21; and $\beta$ is a threshold coefficient.

Assuming that the time interval t which satisfies $VS = \beta \cdot E$ is the delay time DT, the delay time DT is given in consideration of a fixed delay K0 by:

$$DT = K0 + C(RS+R) \left( \ln\left( \frac{RS}{RS+R} \right) + \ln\left( \frac{1}{1-\beta} \right) \right) \quad (2)$$

A detailed delay calculation equation based on delay parameters K1 to K3 is modeled as:

$$DT = K1 + K2 \cdot C^{K3} \quad (3)$$

where K1 to K3 are functions of slew rate tr.

In general, since dependent relation between the output impedance RS and resistance lumped constant R of the macro cell 21 is negligible, the approximation with R=0 in Equation (2) is justified. By comparing Equation (3) with Equation (2) in which the approximation with R=0 is made, the fixed delay term K0 becomes equal to K1, and the output impedance RS is determined as:

$$RS = K2 \cdot C^{(K3-1)} / \ln\left( \frac{1}{1-\beta} \right) \quad (4)$$

The output impedance RS of the macro cell 21 is not fixed for each type of the macro cell 21 but is determined by the input slew rate tr and capacitance lumped constant C of the output-side wiring portion of the macro cell 21. Since the input slew rate tr is correlative with the gate voltage applied to the MOS transistor and the capacitance lumped constant C of the output-side wiring portion is correlative with the drain voltage of the MOS transistor, the output impedance RS is an accurate value which is calculated in consideration of variations in gate and drain voltages of the MOS transistor.

With reference to FIG. 5, the delay time calculation apparatus of FIG. 1 will be described hereinafter.

An RC lumped constant calculator 11 receives a layout pattern information D12 including the macro cells 21 and 22 from a layout pattern storage file 12 and extracts an actual wiring length between the macro cells 21 and 22 from the layout pattern information D12. Taking the wiring between the macro cells 21 and 22 as a distributed constant line, the RC lumped constant calculator 11 calculates the resistance lumped constant R and capacitance lumped constant C as the RC lumped constants of the output-side (pin-side) wiring portion of the macro cell 21 from the actual wiring length between the macro cells 21 and 22.

A delay parameter calculator 13 receives the layout pattern information D12 from the layout pattern storage file 12 and recognizes the type of the macro cell 21, to retrieve at least one delay parameter function K(tr) (corresponding to K1 to K3 of Equation (3) in the model of FIG. 2) in accordance with the macro cell 21 from a delay parameter information D14 stored in a delay parameter storage file 14. Reference character tr designates a slew rate of the input signal S21.

The delay parameter calculator 13 calculates the total capacitance on the input side of the macro cell 21 from the layout pattern information D12 to calculate the slew rate tr (V/ns) of the input signal S21 of the macro cell 21 as a function of the total capacitance. By calculating the retrieved delay parameter function K(tr) as a function of the slew rate tr, the delay parameter calculator 13 determines the delay parameters K.

An output impedance calculator 15 solves an equation like Equation (4) as a function of the capacitance lumped constant C obtained from the RC lumped constant calculator 11 and the delay parameters K excluding the fixed delay term which are obtained from the delay parameter calculator 13, to calculate the output impedance RS of the macro cell 21.

A delay time calculator 16 solves an equation like Equation (2) as a function of the capacitance and resistance lumped constants C and R obtained from the RC lumped constant calculator 11, the delay parameter K corresponding to the fixed delay term which is obtained from the delay parameter calculator 13 and the output impedance RS obtained from the output impedance calculator 13, to calculate the delay time DT it takes to transmit the signal from the input to the output of the macro cell 21.

Figure 3:
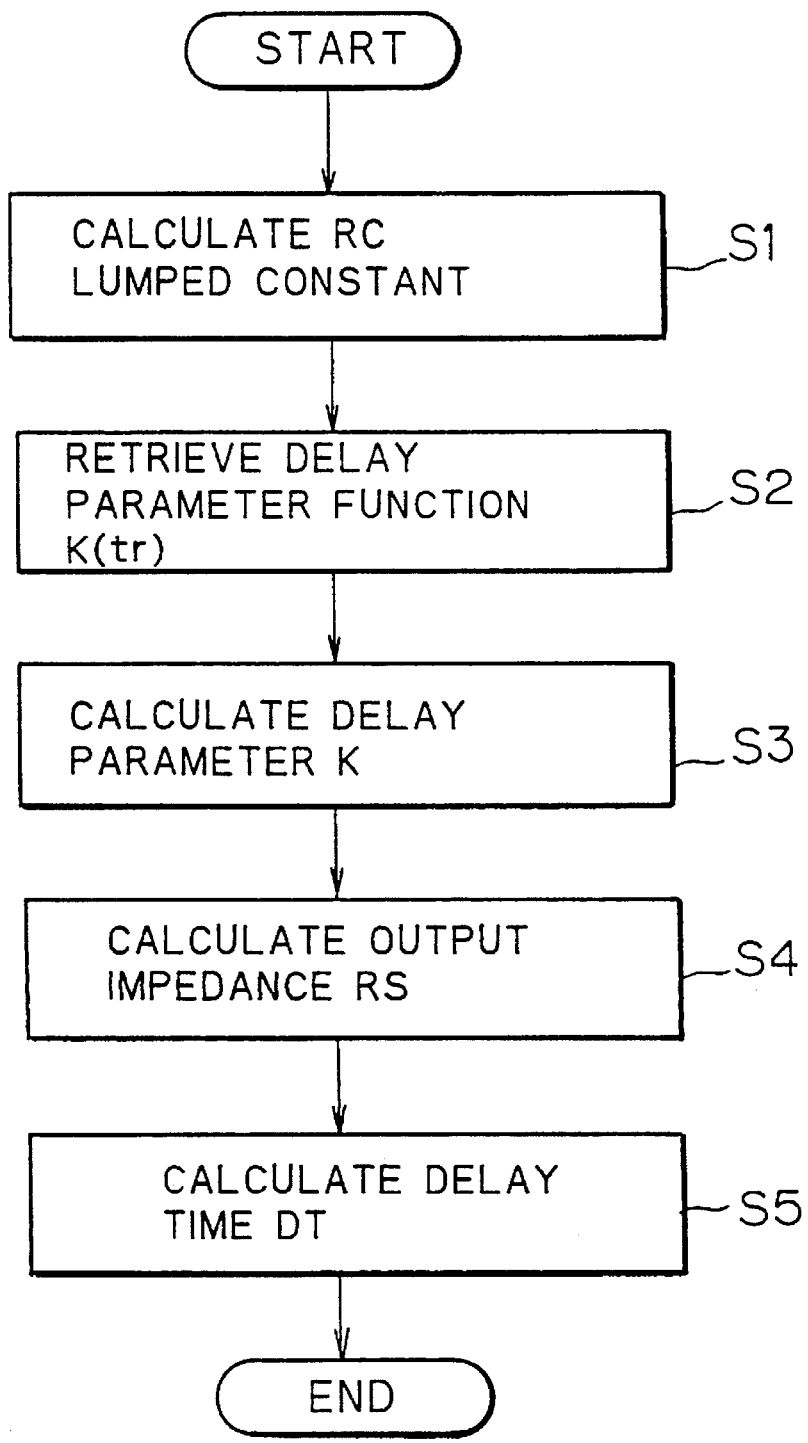
FIG. 3 is a flow chart showing operations of the delay time calculation apparatus of FIG. 1.
Figure 4:
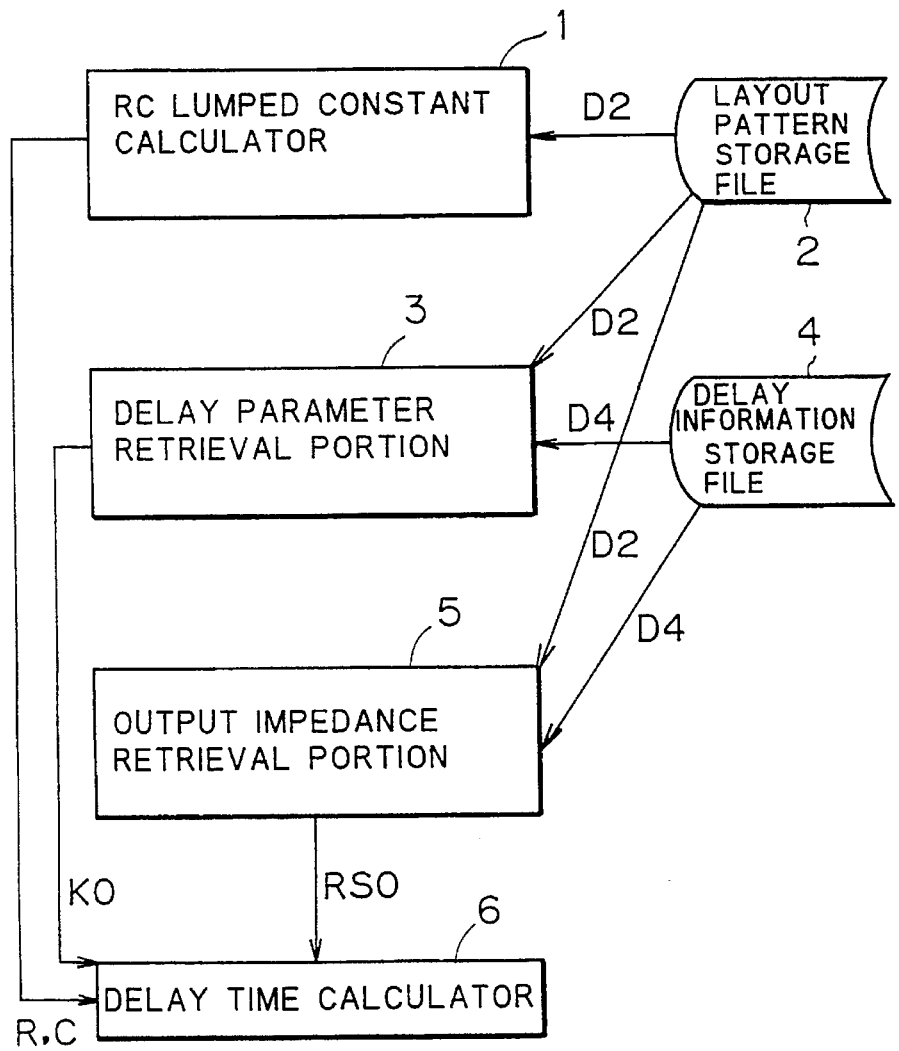
FIG. 4 is a block diagram of a conventional delay time calculation apparatus.

FIG. 3 is a flow chart showing operations of the delay time calculation apparatus of FIG. 1.

With reference to FIG. 3, the RC lumped constant calculator 11 calculates the resistance and capacitance lumped constants R and C as the RC lumped constants of the output-side wiring portion of the macro cell 21 as a function of the actual wiring length between the macro cells 21 and 22 which is extracted from the layout pattern information D12 received from the layout pattern storage file 12, in the step S1.

In the step S2, the delay parameter calculator 13 receives the layout pattern information D12 from the layout pattern storage file 12 and recognizes the type of the macro cell 21, to retrieve at least one delay parameter function K(tr) in accordance with the macro cell 21 from the delay parameter information D14 stored in the delay parameter storage file 14.

In the step S3, the delay parameter calculator 13 calculates the total capacitance on the input side of the macro cell 21 from the layout pattern information D12 to calculate the slew rate tr of the input signal S21 of the macro cell 21 as a function of the total capacitance. By calculating the delay parameter function K(tr) as a function of the slew rate tr, the delay parameter calculator 13 determines the delay parameters K.

In the step S4, the output impedance calculator 15 solves the equation like Equation (4) as a function of the capacitance lumped constant C obtained from the RC lumped constant calculator 11 and the delay parameters K excluding the fixed delay term which are obtained from the delay parameter calculator 13, to calculate the output impedance RS of the macro cell 21.

In the step S5, the delay time calculator 16 solves the equation like Equation (2) as a function of the capacitance and resistance lumped constants C and R obtained from the RC lumped constant calculator 11, the delay parameter K corresponding to the fixed delay term which is obtained from the delay parameter calculator 13 and the output impedance RS obtained from the output impedance calculator 13, to calculate the delay time DT it takes to transmit the signal from the input to the output of the macro cell 21.

As above described, the output impedance RC of the macro cell 21 which is a significant parameter of the delay time calculation equation is correctly determined as a function of the input slew rate and output wiring capacitance which are dependent respectively on the gate and drain voltages of the MOS transistor in the calculation of the delay time DT. This enables the accuracy of the delay time DT to be rapidly improved as compared with that of the prior art. Since the fixed delay term (e.g., K3 in Equation (3)) is not fixed but is calculated as a function of the input slew rate tr, the accuracy of the delay time DT is correspondingly improved. Since each of the delay parameters K is a function of the input slew rate tr, the capacitance to be stored in the delay parameter file 14 is not largely increased as compared with that of the prior art.

The detailed delay calculation equation used for the determination of the output impedance RS of the macro cell 21 is not limited to Equation (3) but may be modeled as:

$$DT = C \left\{ A1 + A2 \cdot \left(\frac{Ci}{C}\right)^{A3} \right\} + A4 \qquad (5)$$

where Ci is a function of the slew rate tr, and A1 to A4 are constants.

By comparing Equation (5) with Equation (2) in which the approximation with R=0 is made, the fixed delay term K0 becomes equal to A4, and the output impedance RS is determined as:

$$RS = \left\{ A1 + A2 \cdot \left(\frac{Ci}{C}\right)^{A3} \right\} / \ln\left(\frac{1}{1-\beta}\right) \qquad (6)$$

The preferred embodiment employs the respectively single RC lumped constants R and C of the macro cell 21. The present invention, however, is applicable to an RC model which is approximated to a lumped constant circuit by using two or more constants R and C.

While the invention has been shown and described in detail, the foregoing description is in all aspects illustrative and not restrictive. It is therefore understood that numerous modifications and variations can be devised without departing from the scope of the invention.

What is claimed is:

1. An apparatus for calculating a delay time it takes to transmit a signal from an input portion to an output portion of a logic functional block including an MOS transistor, comprising:

means for providing an arrangement and wiring result including a layout pattern ranging from said input portion to said output portion of said logic functional block;

delay parameter storage means for storing at least one delay parameter which is a function of input slew rate in accordance with various logic functional blocks;

an RC lumped constant calculator for calculating an RC lumped constant of an output-side wiring portion of said logic functional block as a function of said arrangement and wiring result;

delay parameter determination means for receiving a delay parameter in accordance with said logic functional block as a selected delay parameter from said delay parameter storage means and determining an input slew rate of said logic functional block as a function of said arrangement and wiring result to output an value of said selected delay parameter determined by said input slew rate as a selected delay parameter determined value;

output impedance calculation means for calculating an output impedance of said logic functional block from a predetermined output impedance calculation equation as a function of a capacitance of said RC lumped constant and said selected delay parameter determined value; and delay time calculation means for calculating said delay time from a predetermined delay time calculation equation as a function of said RC lumped constant and said output impedance.

2. The apparatus of claim 1, wherein said logic functional block is a CMOS inverter.

3. The apparatus of claim 1, wherein said predetermined delay time calculation equation is expressed as:

$$DT = K0 + C(RS+R)\left(\ln\left(\frac{RS}{RS+R}\right) + \ln\left(\frac{1}{1-\beta}\right)\right)$$

where K0 is said selected delay parameter determined value, C is said capacitance of said RC lumped constant, R is a resistance of said RC lumped constant, $\beta$ is a threshold voltage coefficient, RS is said output impedance, and DT is said delay time.

4. The apparatus of claim 3, wherein said predetermined output impedance calculation equation is expressed as:

$$RS = K2 \cdot C^{(K3-1)}/\ln\left(\frac{1}{1-\beta}\right)$$

where K2 and K3 are said selected delay parameter determined values, C is said capacitance of said RC lumped constant, $\beta$ is said threshold voltage coefficient, and RS is said output impedance.

5. The apparatus of claim 3, wherein said predetermined output impedance calculation equation is expressed as:

$$RS = \left\{A1 + A2 \cdot \left(\frac{Ci}{C}\right)^{A3}\right\}/\ln\left(\frac{1}{1-\beta}\right)$$

where A1 to A3 are said selected delay parameter determined values, C is said capacitance of said RC lumped constant, $\beta$ is said threshold voltage coefficient, Ci is a capacitance on an input side of said logic functional block, and RS is said output impedance.

* * * * *